United States Patent
Wang et al.

(10) Patent No.: US 7,824,964 B2
(45) Date of Patent: Nov. 2, 2010

(54) METHOD FOR FABRICATING PACKAGE STRUCTURES FOR OPTOELECTRONIC DEVICES

(75) Inventors: Kai-Chih Wang, Taoyuan (TW); Fang-Chang Liu, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 81 days.

(21) Appl. No.: 12/412,479

(22) Filed: Mar. 27, 2009

(65) Prior Publication Data

US 2009/0186449 A1    Jul. 23, 2009

Related U.S. Application Data

(62) Division of application No. 11/652,084, filed on Jan. 11, 2007, now Pat. No. 7,566,944.

(51) Int. Cl.
*H01L 21/82* (2006.01)
(52) U.S. Cl. .................. 438/113; 438/114; 438/458; 257/620; 257/621
(58) Field of Classification Search .......... 438/113–114, 438/458; 257/620–621, E21.599
See application file for complete search history.

(56) References Cited

U.S. PATENT DOCUMENTS

| 2006/0033198 | A1 | 2/2006 | Noma et al. |
| 2006/0079019 | A1* | 4/2006 | Kim ........................... 438/106 |
| 2007/0026639 | A1* | 2/2007 | Noma et al. ................ 438/459 |
| 2008/0128914 | A1 | 6/2008 | Morita et al. |
| 2008/0283951 | A1 | 11/2008 | Nabe et al. |

* cited by examiner

*Primary Examiner*—Theresa T Doan
(74) *Attorney, Agent, or Firm*—Muncy, Geissler, Olds & Lowe, PLLC

(57) ABSTRACT

A package structure for an optoelectronic device. The package structure comprises a device chip reversely disposed on a first substrate, which comprises a second substrate and a first dielectric layer between the first and second substrates. The first dielectric layer comprises a pad formed in a corner of the first dielectric layer non-overlapping the second substrate, such that the surface and sidewall of the pad are exposed. A metal layer is formed directly on the exposed surface of the pad and covers the second substrate. A protective layer covers the metal layer, having an opening to expose a portion of the metal layer on the second substrate. A solder ball is disposed in the opening, electrically connecting to the metal layer. The invention also discloses a method for fabricating the same.

10 Claims, 9 Drawing Sheets

METHOD FOR FABRICATING PACKAGE STRUCTURES FOR OPTOELECTRONIC DEVICES

CROSS REFERENCE TO RELATED APPLICATION

This application is a Divisional of U.S. patent application Ser. No. 11/652,084, filed Jan. 11, 2007 now U.S. Pat. No. 7,566,944 and entitled "PACKAGE STRUCTURE FOR OPTOELECTRONIC DEVICE AND FABRICATION METHOD THEREOF".

BACKGROUND OF THE INVENTION

1. Field of the Invention

The invention relates to semiconductor package technology and in particular to a wafer-level chip scale package (WLCSP) structure for an optoelectronic device.

2. Description of the Related Art

Digital image devices are widely used in, for example, digital cameras, digital video recorders, cellular phones with image capture function, and monitors. A digital imaging sensor typically includes an optoelectronic device chip, such as a charge-coupled device (CCD) image sensor chip and CMOS image sensor chip.

Such image sensor chips may be packaged by an advanced package technology called "WLCSP". In the traditional package technology, a wafer having micro-devices, such as electronic devices, electromechanical devices or optoelectronic devices formed thereon, is first diced into multiple chips, and thereafter the chips are packaged. Unlike the traditional package technology, according to WLCSP, micro-devices may be packaged prior to dicing a wafer into multiple chips.

FIGS. 1 and 2 are cross-sections of a pair of package structures for front and back-illuminated optoelectronic devices, respectively. In particular, the optoelectronic devices, such as image sensors, are packaged by WLCSP. In FIG. 1, each package structure comprises a device chip disposed between a pair of glass substrates 100 and 110. The device chip includes a device substrate 106 having micro-devices (not shown) thereon and a dielectric layer 104 formed on the device substrate 106. An extension pad 105 is formed in the dielectric layer 104, comprising a pad portion 103 and an extending portion 101. The device chip is bonded with the glass substrate 100 through a glue layer 102 formed therebetween. Moreover, the device chip is bonded with the glass substrate 110 through a glue layer 108 formed therebetween. A buffer layer 112 is disposed on the glass substrate 110. A metal layer 114 covers the glass substrates 100 and 110 and directly contacts the sidewall of the pad portion 103 of the extension pad 105. A protective layer 116 is disposed on the metal layer 114, having an opening above the buffer layer 112. A solder ball 118 is disposed in the opening to electrically connect the metal layer 114, serving as a connection between internal and external circuits.

In FIG. 2, each package structure also comprises a device chip disposed between a pair of glass substrates 200 and 212. The device chip is reversely placed on a carrier substrate 208, including a device substrate 204 and a dielectric layer 206 between the device and carrier substrates 204 and 208. An extension pad 205 is formed in the dielectric layer 206, comprising a pad portion 203 and an extending portion 201. Glue layers 202 and 210 are employed to bond the device chip to the glass substrates 200 and 212, respectively. Similar to the package structure shown in FIG. 1, a buffer layer 214, a metal layer 216, a protective layer 218 and a solder ball 220 are successively disposed on the glass substrate 212.

In such package structures, the contact area between the package metal layer 114 or 216 and the extension pad 105 or 205 is limited to the thickness of the pad portion 103 or 203 of the extension pad 105 or 205. Accordingly, as the device size is reduced to increase device density, resistance of the extension pad 105 or 205 is increased and device performance reduced. Although the extending portion 101 or 201 of the extension pad 105 or 205 can reduce resistance thereof, the device size may be increased. Thus, difficulty in device size reduction is increased. Moreover, the small contact area between the metal layer and the extension pad is detrimental for adhesion between the metal layer and the extension pad.

Thus, there exists a need for a package structure for an optoelectronic device with increased contact area between the pad and package metal layer.

BRIEF SUMMARY OF THE INVENTION

A detailed description is given in the following embodiments with reference to the accompanying drawings. Package structures for optoelectronic devices and methods for fabricating the same are provided. An embodiment of a package structure for an optoelectronic device comprises a device chip reversely disposed on a first substrate, comprising a second substrate and a first dielectric layer between the first and second substrates. The first dielectric layer comprises a pad formed in a corner of the first dielectric layer non-overlapping the second substrate, such that the surface and sidewall of the pad are exposed. A metal layer is formed directly on the exposed surface of the pad and covers the second substrate. A protective layer covers the metal layer, having an opening to expose a portion of the metal layer on the second substrate. A solder ball is disposed in the opening, electrically connecting to the metal layer.

Another embodiment of a package structure for an optoelectronic device comprises a device chip disposed between first and second substrates, comprising a third substrate adjacent to the first substrate and a first dielectric layer between the second and third substrate. The first dielectric layer comprises a pad formed in a corner of the first dielectric layer non-overlapping the second substrate, such that the surface and sidewall of the pad are exposed. A metal layer is formed directly on the exposed surface of the pad and covers the second substrate. A protective layer covers the metal layer, having an opening exposing a portion of the metal layer on the second substrate. A solder ball is disposed in the opening, electrically connecting to the metal layer.

An embodiment of a method for fabricating package structures for optoelectronic devices comprises reversely placing a device wafer on a first substrate, in which the device wafer comprises a second substrate and a first dielectric layer between the first and second substrates. The first dielectric layer comprises at least one pair of pads formed in the first dielectric layer. A first opening is formed in the second substrate and the first dielectric layer to expose the surface and sidewall of the pair of pads. A metal layer is formed directly on the exposed surface of each pad and covers the second substrate. A protective layer is formed on the metal layer and fills the first opening in the first dielectric layer. At least one second opening is formed in the protective layer, corresponding to each pad and exposing a portion of the metal layer on the second substrate. A solder ball is formed in the second opening, electrically connecting to the metal layer. The device wafer and the first substrate are diced along the first opening in the first dielectric layer.

Another embodiment of a method for fabricating package structures for optoelectronic devices comprises placing a device wafer between first and second substrates, in which the device wafer comprises a third substrate adjacent to the first substrate and a first dielectric layer between the second and third substrates. The first dielectric layer comprises at least one pair of pads formed in the first dielectric layer. A first opening is formed in the second substrate and the first dielectric layer to expose the surface and sidewall of the pair of pads. A metal layer is formed directly on the exposed surface of each pad and covers the second substrate. A protective layer is formed on the metal layer and fills the first opening in the first dielectric layer. At least one second opening is formed in the protective layer, corresponding to each pad and exposing a portion of the metal layer on the second substrate. A solder ball is formed in the second opening, electrically connecting to the metal layer. The device wafer and the first substrate are diced along the first opening in the first dielectric layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
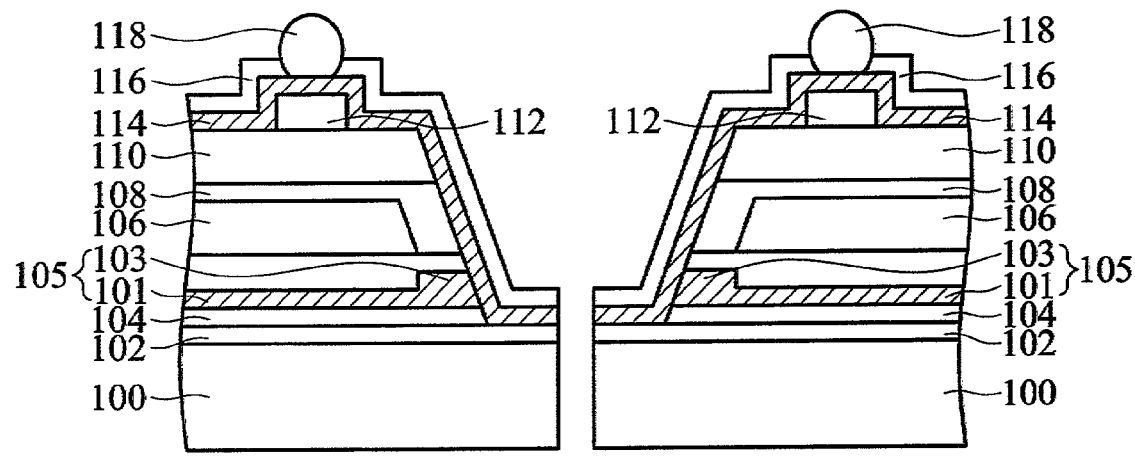
FIG. 1 is a cross section of a pair of package structures for front-illuminated optoelectronic devices.
Figure 2:
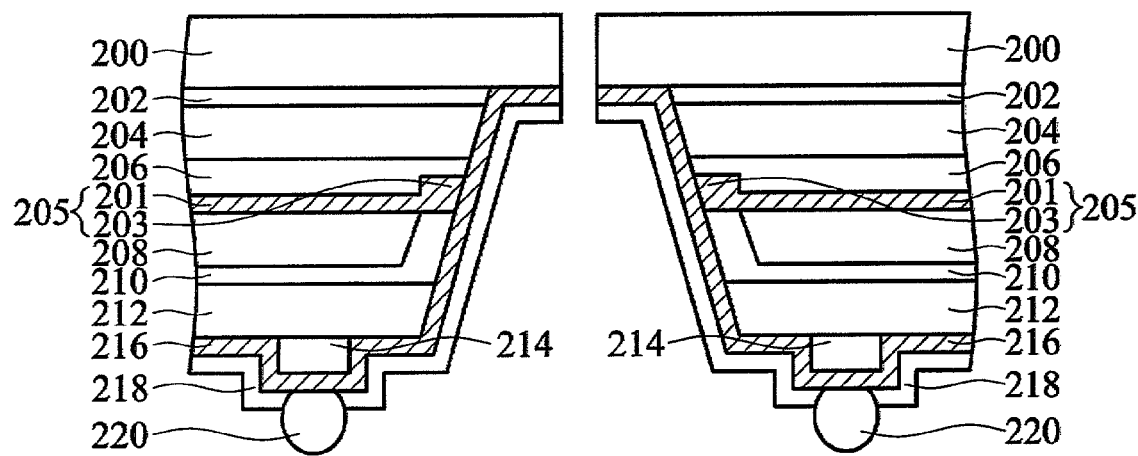
FIG. 2 is a cross section of a pair of package structures for back-illuminated optoelectronic devices.

The invention relates to a package structure for an optoelectronic device and a method for fabricating the same. FIG. 3G illustrates an embodiment of a pair of package structures for front-illuminated optoelectronic devices, such as image sensors. Each package structure comprises a device chip bonded with a substrate 306 through a glue layer 304, such that the device chip is reversely disposed on the substrate 306. The device chip may comprise a device substrate 300a and a dielectric layer 302 between the substrate 306 and the device substrate 300a. In this embodiment, the dielectric layer 302 comprises a pad 301 formed in a corner of the dielectric layer 302 non-overlapping the device substrate 300a, such that the surface 301a and sidewall 301b of the pad 301 are exposed. In some embodiments, the pad 301 may have an extending portion (not shown) similar to the extension pad 105 or 205 shown in FIG. 1 or 2.

A dielectric layer 308 covers the reverse device substrate 300a, serving as an insulator for subsequent metal formation. A metal layer 310 is formed directly on the exposed surface 301a of the pad 301 and covers the dielectric layer 308 above the device substrate 300a. A protective layer 312 covers the metal layer 310, having an opening 310a to expose a portion of the metal layer 310 on the device substrate 300a. Moreover, the protective layer 312 further extends to the exposed sidewall 301b of the pad 301 to prevent exposure of metal layer 310 and pad 301 to the air. A solder ball 314 is disposed in the opening 310a, electrically connecting to the metal layer 310.

Figure 4:
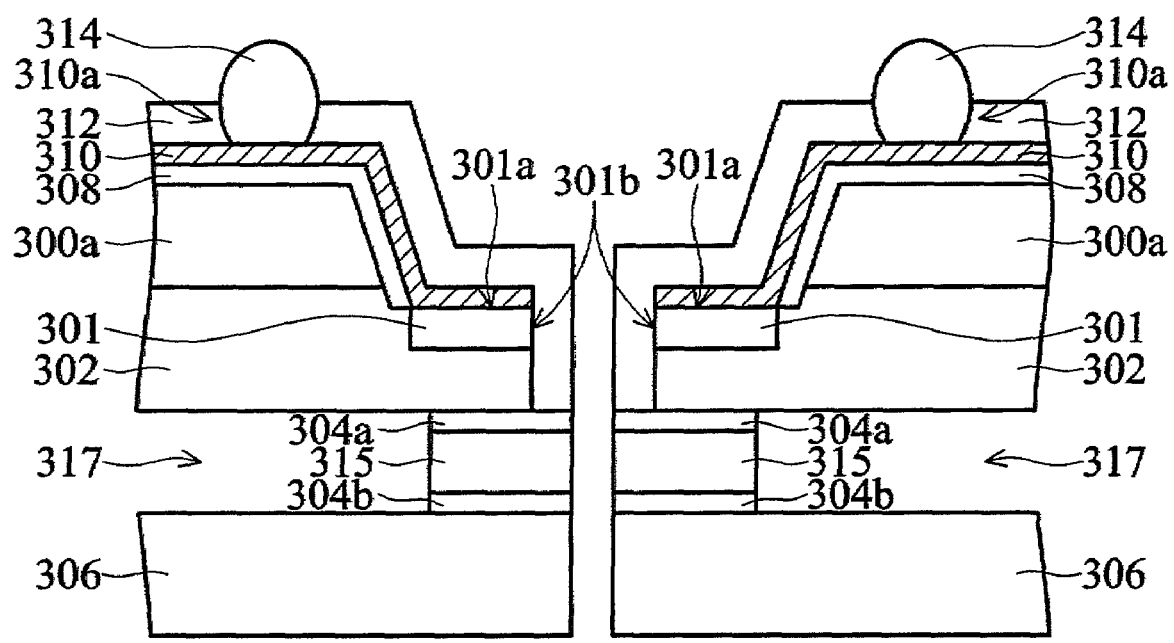
FIG. 4 is a cross section of an embodiment of a pair of package structures for front-illuminated optoelectronic devices.

In some embodiments, a dam 315 may be disposed between the substrate 306 and the dielectric layer 302 of the device chip to form a cavity 317 therebetween, as shown in FIG. 4.

Figure 3A:
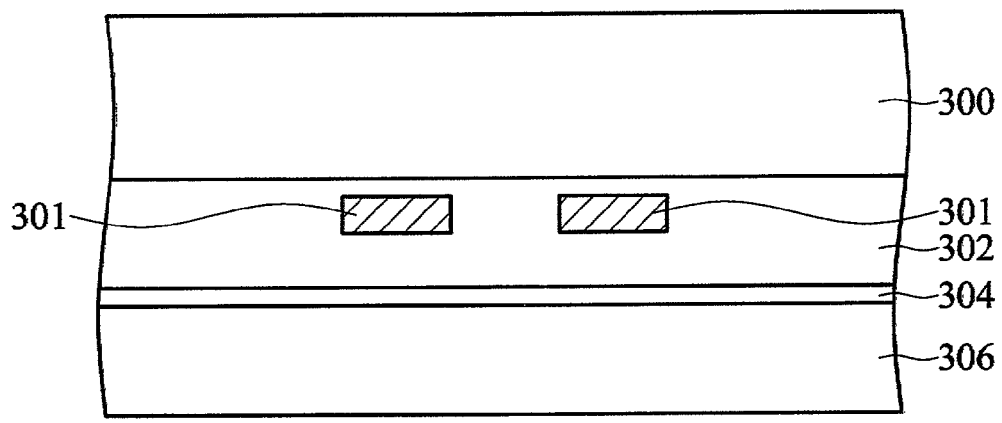
FIGS. 3A to 3G are cross sections of an embodiment of a method for fabricating package structures for front-illuminated optoelectronic devices.
Figure 3B:
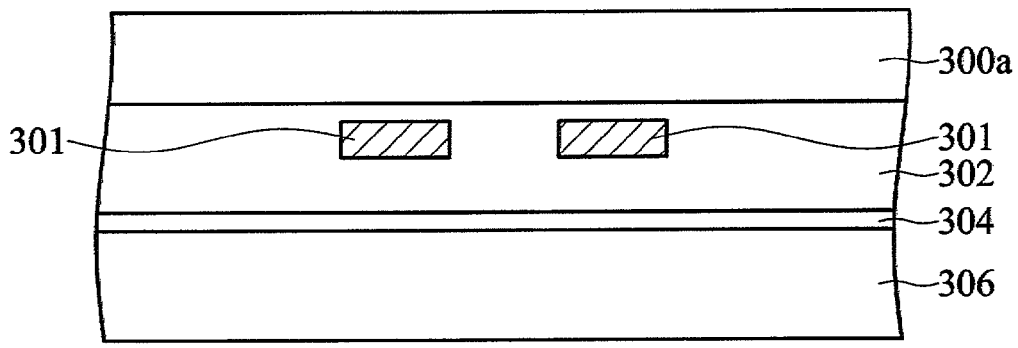
Figure 3C:
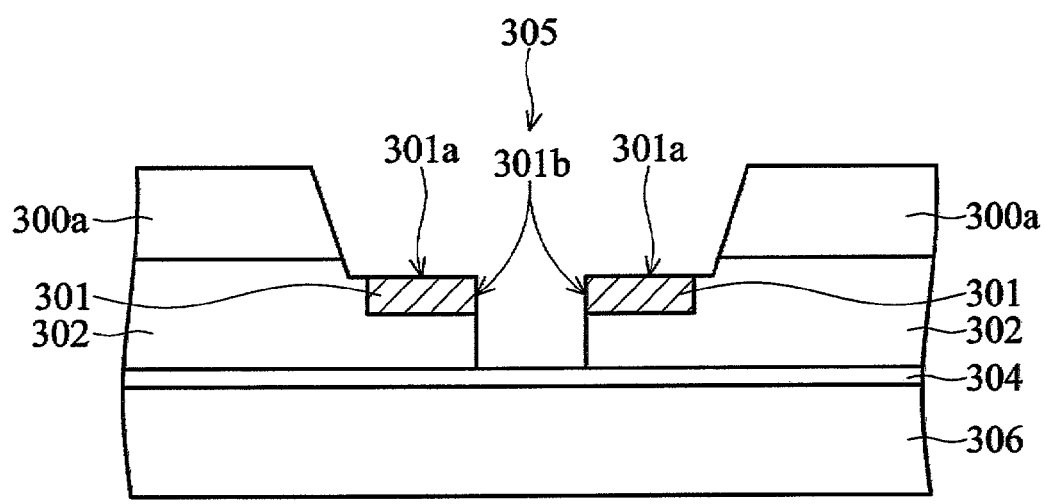
Figure 3D:
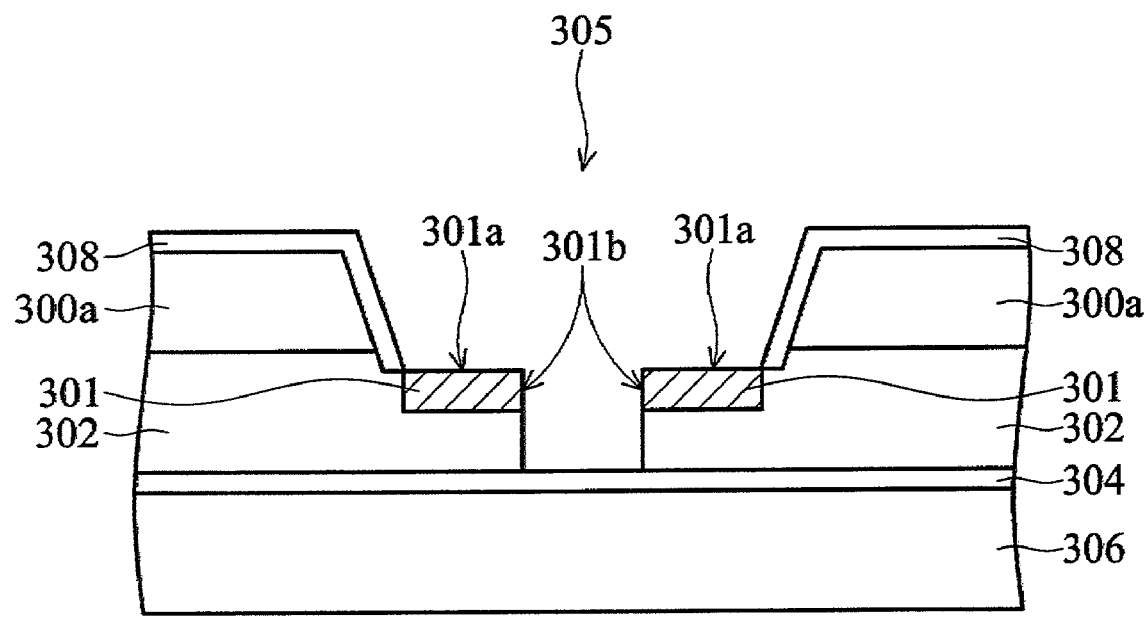
Figure 3E:
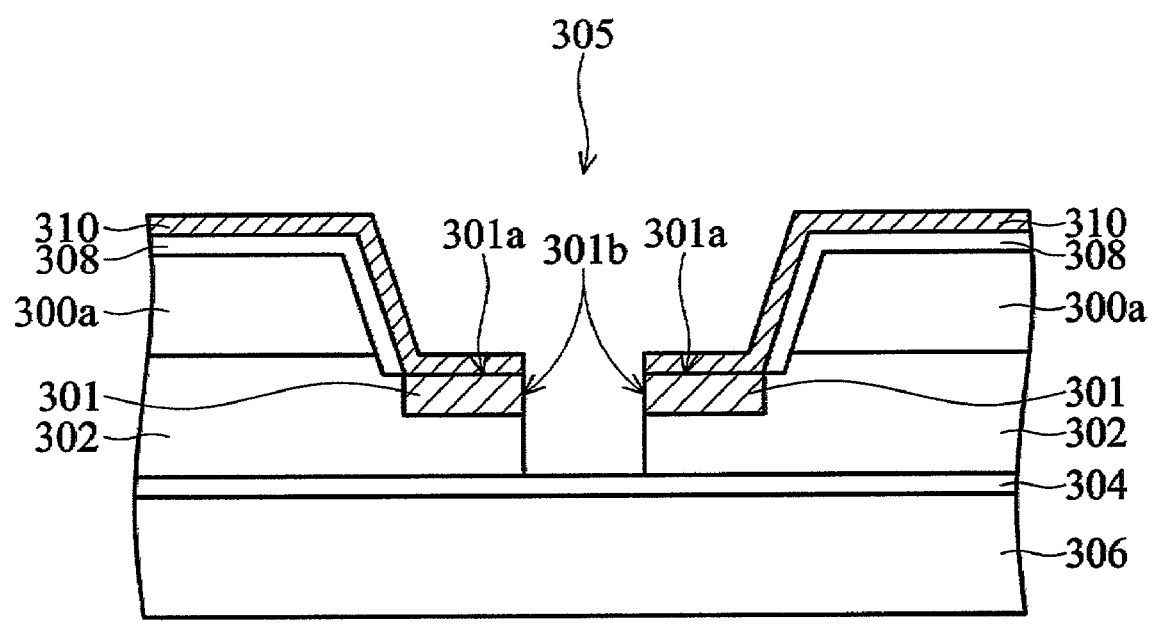
Figure 3F:
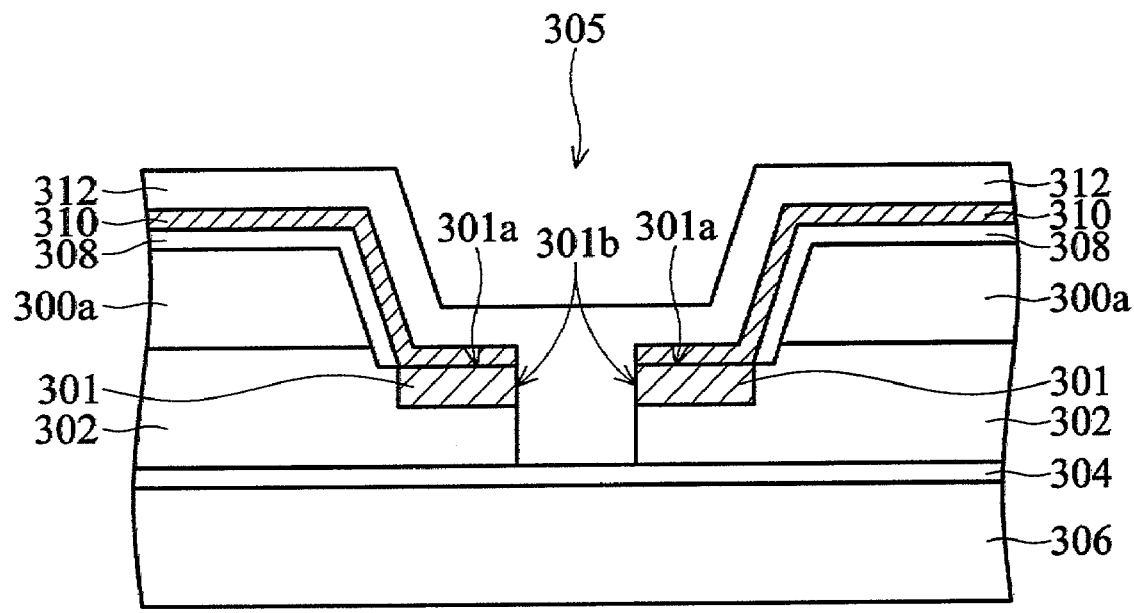
Figure 3G:
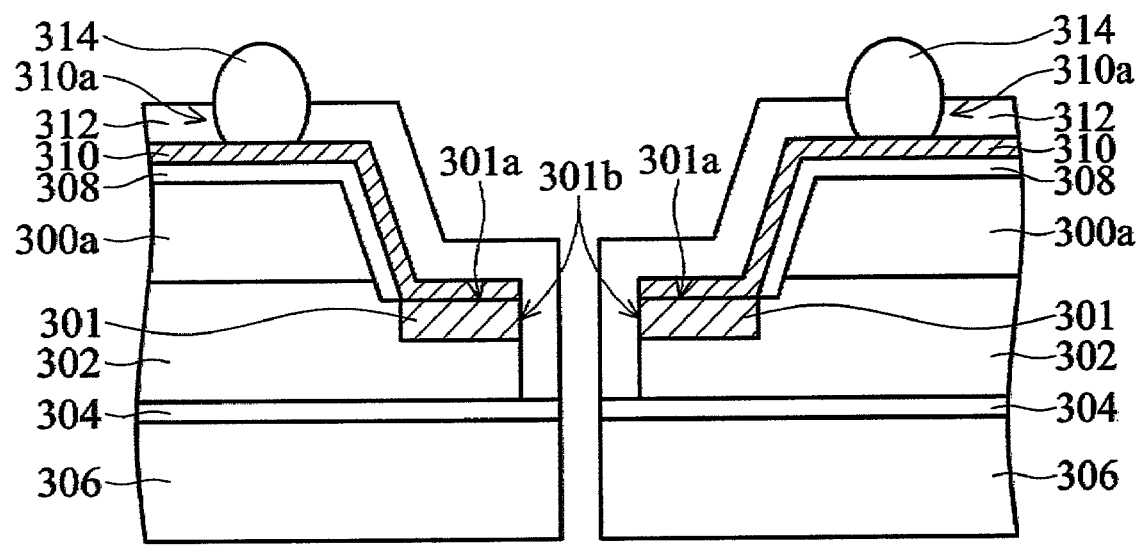

FIGS. 3A to 3G are cross sections of an embodiment of a method for fabricating package structures for front-illuminated optoelectronic devices. As shown in FIG. 3A, an optoelectronic device wafer and a substrate 306, such as a glass substrate or other transparent substrate, is provided. The optoelectronic device wafer is reversely mounted on the substrate 306 through a glue layer 304. In this embodiment, the optoelectronic device wafer comprises a device substrate 300, such as a silicon substrate or other semiconductor substrate and a dielectric layer 302 formed thereon. The device substrate 300 may contain a variety of elements, including, for example, transistors, resistors, and other semiconductor elements as are known in the art. The device substrate 300 may also contain conductive layers, insulating layers or isolation structures. The conductive layer typically comprises metal, such as copper, commonly used in the semiconductor industry for wiring discrete optoelectronic devices, such as image sensors, in and on the substrate. In order to simplify the diagram, a flat substrate is depicted.

The dielectric layer 302 disposed on the device substrate 300 may comprise silicon oxide or other low k materials, such as fluorinated silicate glass (FSG), carbon doped oxide, methyl silsesquioxane (MSQ), hydrogen silsesquioxane (HSQ), or fluorine tetra-ethyl-orthosilicate (FTEOS). Additionally, in some embodiments, the dielectric layer 302 may comprise multiple layers. A plurality of pads is embedded in the dielectric layer 302. In order to simplify the diagram, only a pair of pads 301 is depicted. In this embodiment, the pad 301 comprises metal, such as copper or aluminum. As mentioned above, the pad 301 may further comprise an extending portion (not shown). After mounting the device wafer on the substrate 306, the device substrate 300 is reduced to a predetermined thickness by polishing or etching, to leave a portion of device substrate 300a, as shown in FIG. 3B. In some embodiments, the device substrate 300 can be thinned prior to mounting the device wafer and the substrate 306.

As shown in FIG. 3C, the device substrate 300a and the dielectric layer 302 are successively patterned to form an opening 305 therein, where the surfaces 301a and sidewalls 301b of the pair of pads 301 are exposed.

Next, a dielectric layer 308 is conformally deposited on the device substrate 300a and the inner surface of the opening 305 by conventional deposition, such as chemical vapor deposition (CVD). Thereafter, the dielectric layer 308 on the surfaces 301a and sidewalls 301b of the pair of pads 301 are removed by etching, as shown in FIG. 3D.

A metal layer 310 is conformally deposited on the dielectric layer 308 and the inner surface of the opening 305 by conventional deposition, such as CVD or sputtering, such that the metal layer 310 is formed directly on the surface 301a of the pair of pads 301. Thereafter, the metal layer 310 on the inner surface of the opening 305 in the dielectric layer 302 is removed by etching, as shown in 3E. The remaining metal layer 310 serves an electronic connection between the pad 301 and the subsequent solder ball.

As shown in FIG. 3F, a protective layer 312, such as a silicon nitride layer, is formed by, for example, CVD, to cover the metal layer 310 and fill the opening 305 in the dielectric layer 302.

Thereafter, a plurality of openings corresponding to pads 301 is formed in the protective layer 312 to expose the metal layer 310. In order to simplify the diagram, only two openings 310a are depicted, as shown in FIG. 3G. Solder balls 314 are correspondingly formed in the openings 310a, such that each solder ball 314 is electrically connected to the corresponding pad 301 through the metal layer 310. After formation of solder balls 314, the device wafer and the substrate 306 are successively diced along the opening 305 in the dielectric layer 302 to form multiple device chips which are packaged. In some embodiments, a dam 315 can be formed between the dielectric layer 302 and the substrate 306 to form a cavity 317 therebetween. The dam 315 may be bonded with the dielectric layer 302 and the substrate 306 through glue layers 304a and 304b, respectively, as shown in FIG. 4.

Figure 5A:
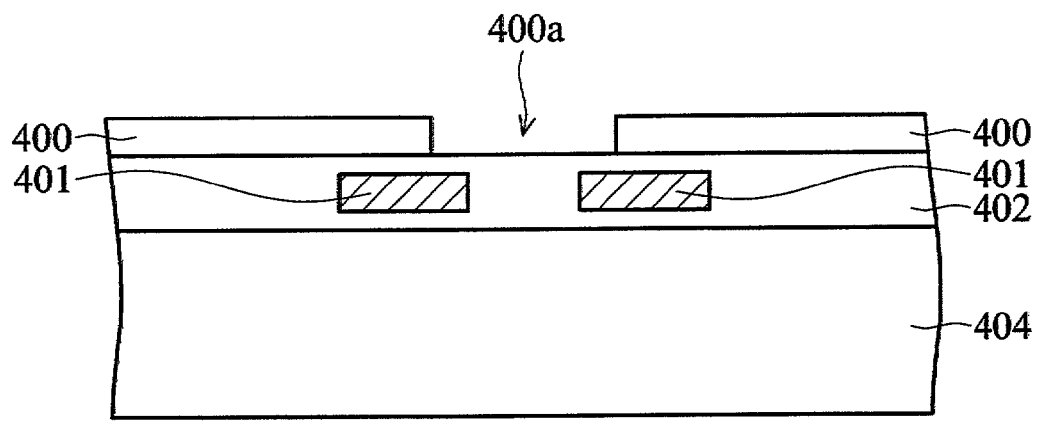
FIGS. 5A to 5G are cross sections of an embodiment of a method for fabricating package structures for back-illuminated optoelectronic devices.
Figure 5B:
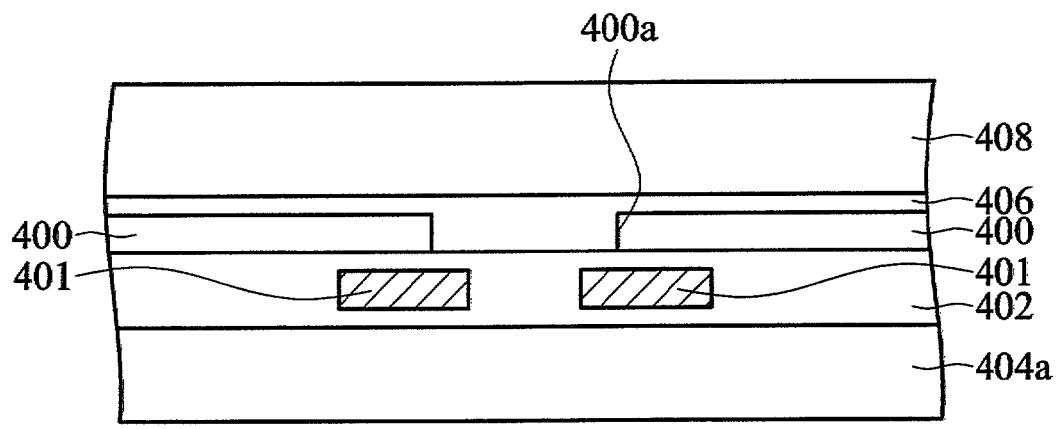
Figure 5C:
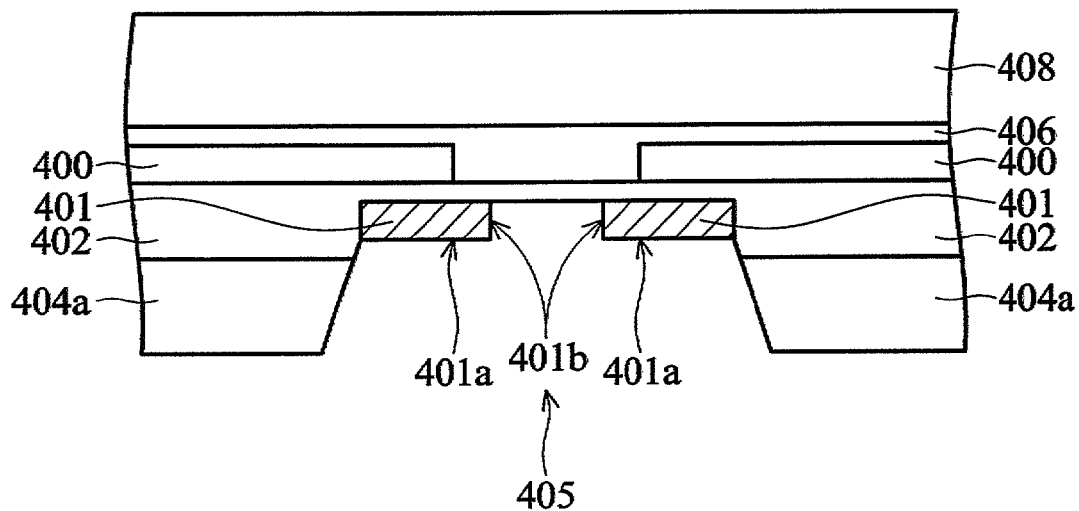
Figure 5D:
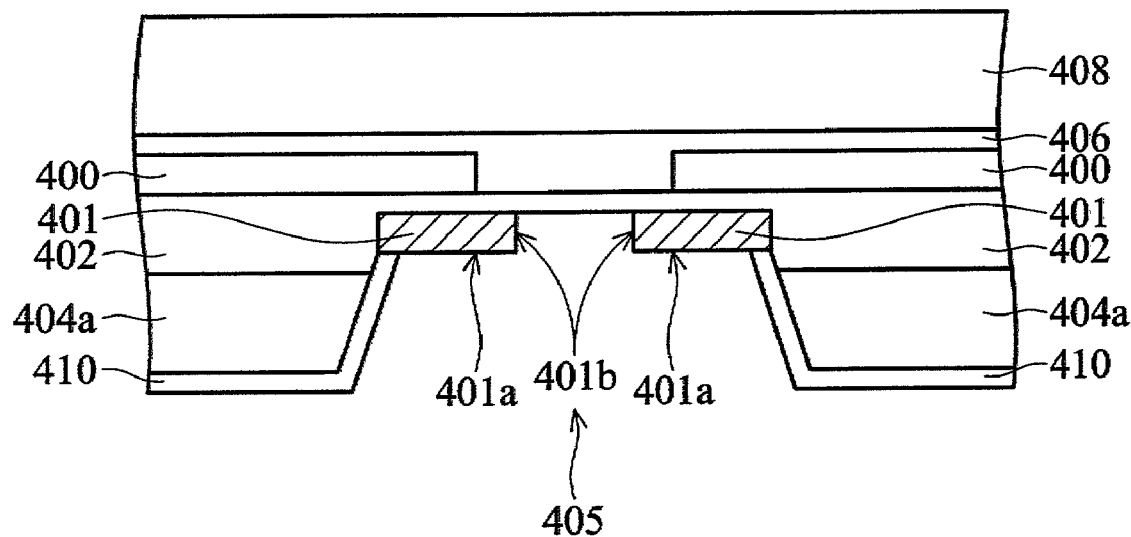
Figure 5E:
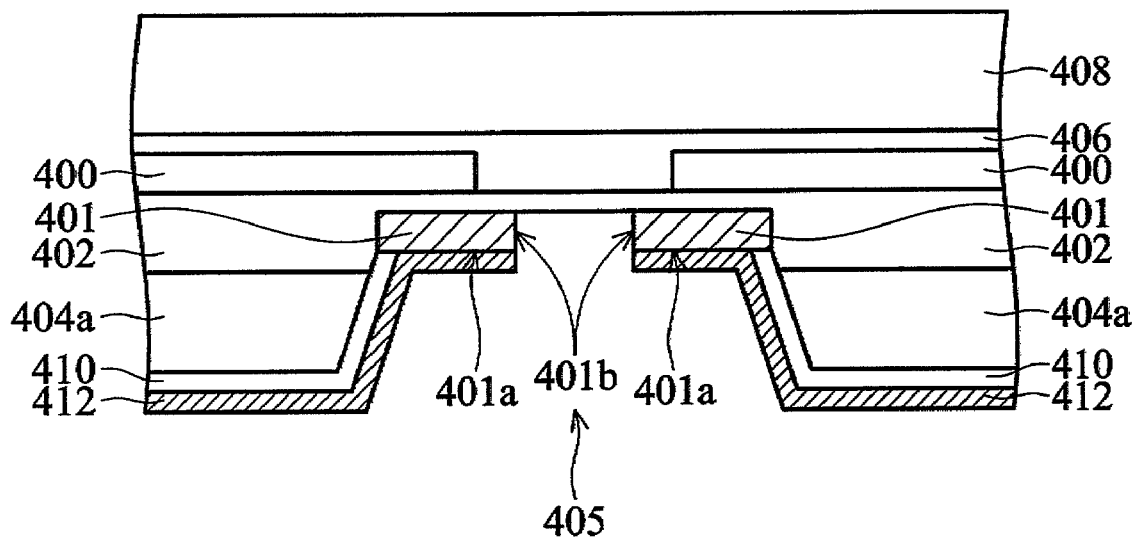
Figure 5F:
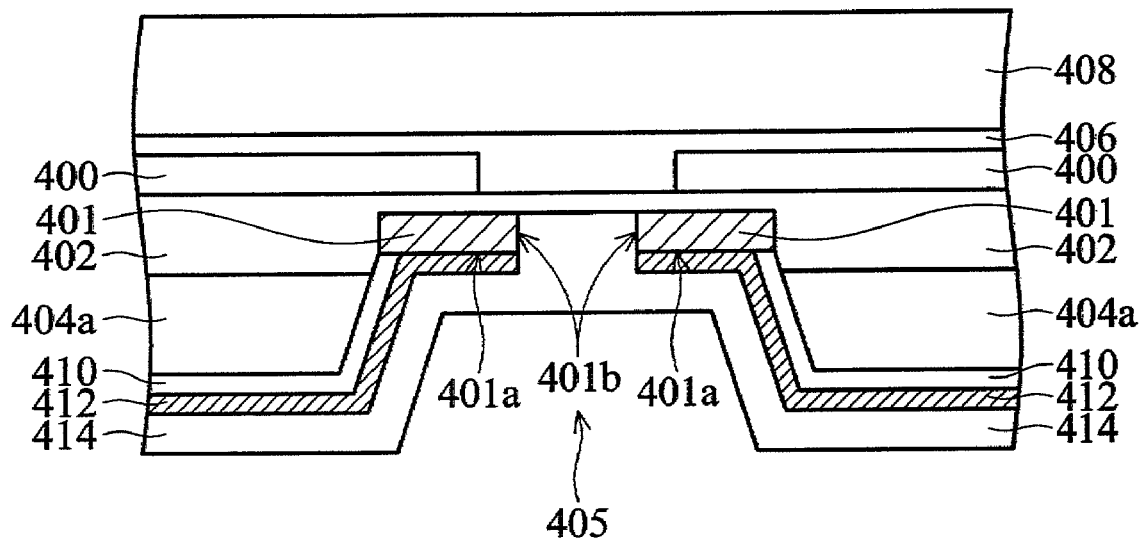
Figure 5G:
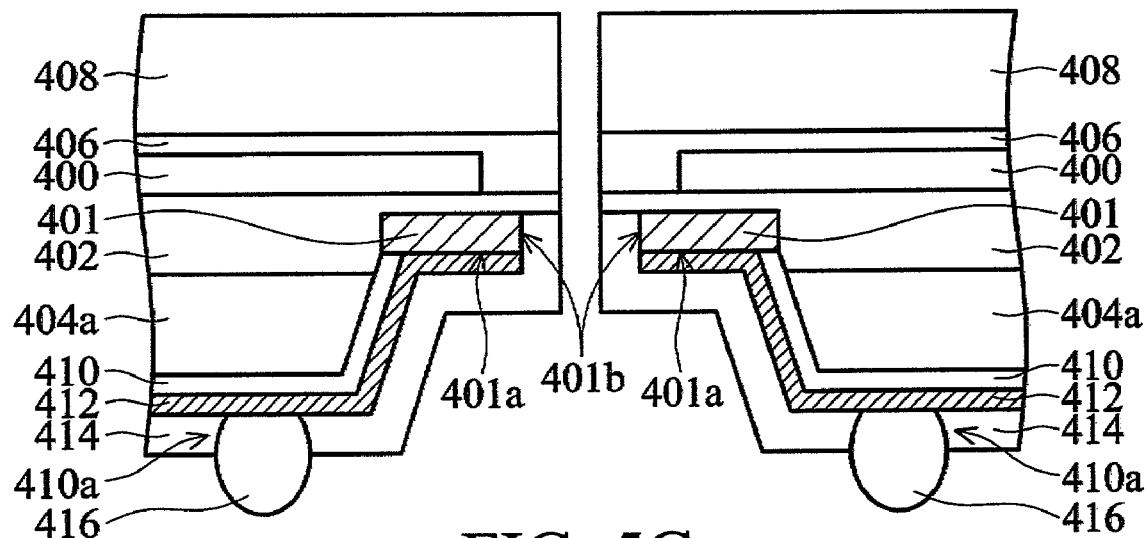

FIG. 5G illustrates another embodiment of a pair of package structures for back-illuminated optoelectronic devices. Each package structure comprises a device chip disposed between substrates 408 and 404a, comprising a device substrate 400 adjacent to the substrate 408 and a dielectric layer 402 between the substrate 404a and the device substrate 400. In this embodiment, the dielectric layer 402 comprises a pad 401 formed in a corner of the dielectric layer 402 non-overlapping the substrate 404a, such that the surface 401a and sidewall 401b of the pad 401 are exposed. In some embodiments, the pad 401 may have an extending portion (not shown) similar to the extension pad 105 or 205 shown in FIG. 1 or 2.

A dielectric layer 410 covers the substrate 404a, serving as an insulator for subsequent metal formation. A metal layer 412 is formed directly on the exposed surface 401a of the pad 401 and covers the dielectric layer 410 on the substrate 404a. A protective layer 414 covers the metal layer 412, having an opening 410a to expose a portion of the metal layer 412 on the substrate 404a. A solder ball 416 is disposed in the opening 410a, electrically connecting to the metal layer 412.

Figure 6:
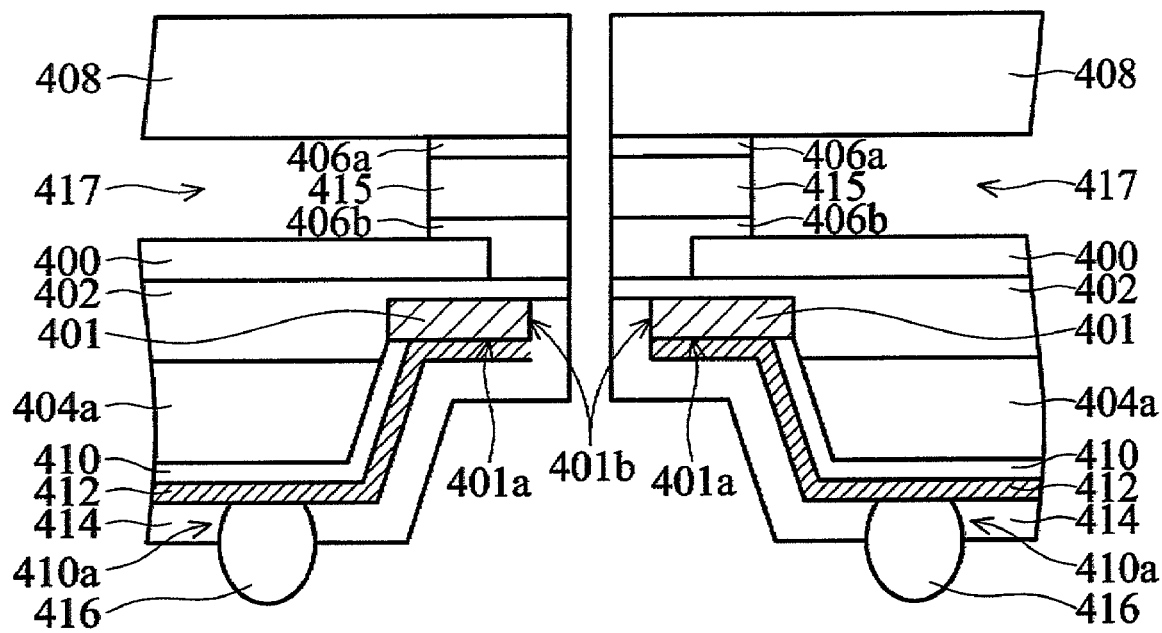
FIG. 6 is a cross section of another embodiment of a pair of package structures for back-illuminated optoelectronic devices.

In some embodiments, a dam 415 may be disposed between the substrate 408 and the device substrate 400 of the device chip to form a cavity 417 therebetween, as shown in FIG. 6.

FIGS. 5A to 5G are cross sections of an embodiment of a method for fabricating package structures for back-illuminated optoelectronic devices. As shown in FIG. 5A, an optoelectronic device wafer and a carrier substrate 404, such as a silicon substrate, are provided. The optoelectronic device wafer is reversely mounted on the carrier substrate 404. In this embodiment, the optoelectronic device wafer comprises a device substrate 400 and a dielectric layer 402 formed thereon. The device substrate 400, such as a silicon substrate or other semiconductor substrate, is similar to the device substrate 300 shown in FIG. 3A.

The dielectric layer 402 disposed on the device substrate 400 may comprise silicon oxide or other low k materials. Additionally, in some embodiments, the dielectric layer 402 may comprise multiple layers. A plurality of pads is embedded in the dielectric layer 402. In order to simplify the diagram, only a pair of pads 401 is depicted. As mentioned above, the pad 401 may further comprise an extending portion (not shown). After mounting the device wafer on the carrier substrate 404, the device substrate 400 is etched to form an opening 400a between the pair of pads 401.

Next, a substrate 408, such as a glass substrate or other transparent substrate is mounted on the device substrate 400 by coating a glue layer 406 on the device substrate 400 and filing in the opening 400a, as shown in FIG. 5B. Thereafter, the carrier substrate 404 is reduced to a predetermined thickness by polishing or etching, to leave a portion of carrier substrate 404a.

As shown in FIG. 5C, the carrier substrate 404a and the dielectric layer 402 are successively patterned to form an opening 405 therein, where the surfaces 401a and sidewalls 401b of the pair of pads 401 are exposed.

As shown in FIG. 5D, a dielectric layer 410 is conformally deposited on the carrier substrate 404a and the inner surface of the opening 405 by conventional deposition, such as CVD. Thereafter, the dielectric layer 410 on the surface 401a and sidewall 401b of the pair of pads 401 is removed by etching.

As shown in 5E, a metal layer 412 is conformally deposited on the dielectric layer 410 and the inner surface of the opening 405 by conventional deposition, such as CVD or sputtering, such that the metal layer 412 is formed directly on the surface 401a of the pair of pads 401. Thereafter, the metal layer 412 on the inner surface of the opening 405 in the dielectric layer 402 is removed by etching. The remaining metal layer 412 electronically connects the pad 401 and the subsequent solder ball.

As shown in FIG. 5F, a protective layer 414, such as a silicon nitride layer, is formed by, for example, CVD, to cover the metal layer 412 and fills the opening 405 in the dielectric layer 402.

Thereafter, a plurality of openings corresponding to pads 401 is formed in the protective layer 414 to expose the metal layer 412. In order to simplify the diagram, only two openings 410a are depicted, as shown in FIG. 5G. Solder balls 416 are correspondingly formed in the openings 410a, such that each solder ball 416 is electrically connected to the corresponding pad 401 through the metal layer 412. After formation of solder balls 416, the device wafer and the substrate 408 are successively diced along the opening 405 in the dielectric layer 402 to form multiple device chips which are packaged. In some embodiments, a dam 415 can be formed between the substrate 408 and the device substrate 400 to form a cavity 417 therebetween. The dam 415 may be bonded with the substrate 408 and the device substrate 400 through glue layers 406a and 406b, respectively, as shown in FIG. 6.

According to the invention, only one glass substrate is utilized for the package structure. Compared to conventional package structures utilizing two glass substrates, package size can be reduced. Since the surface of the pad, acting as a contact area between the metal layer and the pad, can be increased using the sidewall of the pad, thus adhesion therebetween can be enhanced to increase device reliability. Moreover, since using the surface of the pad as the contact area is not limited by the thickness of the pad, the pad without extending portion can be used in the chip of the package structure, thereby increasing device density of the chip. Additionally, since the protective layer is extended to the sidewall of the pad to entirely cover the metal layer on the pad, the metal layer can be prevented from humidity damage after dicing the wafer into multiple chips. Thus, device reliability can be further increased.

While the invention has been described by way of example and in terms of preferred embodiment, it is to be understood that the invention is not limited thereto. To the contrary, it is intended to cover various modifications and similar arrangements (as would be apparent to those skilled in the art).

Therefore, the scope of the appended claims should be accorded the broadest interpretation so as to encompass all such modifications and similar arrangements.

The invention claimed is:

1. A method for fabricating package structures for optoelectronic devices, comprising:
   reversely placing a device wafer on a first substrate, wherein the device wafer comprises:
      a second substrate; and
      a first dielectric layer between the first and second substrates, comprising at least one pair of pads formed in the first dielectric layer;
   forming a first opening in the second substrate and the first dielectric layer to expose the surface and sidewall of the pair of pads;
   forming a metal layer directly on the exposed surface of each pad and covering the second substrate;
   forming a protective layer on the metal layer and filling the first opening in the first dielectric layer;
   forming at least one second opening in the protective layer, corresponding to each pad and exposing a portion of the metal layer on the second substrate;
   forming a solder ball in the second opening, electrically connecting to the metal layer; and
   dicing the device wafer and the first substrate along the first opening in the first dielectric layer.

2. The method as claimed in claim 1, further forming a second dielectric layer between the second substrate and the metal layer.

3. The method as claimed in claim 1, further forming a dam between the first substrate and the first dielectric layer to form a cavity therebetween.

4. The method as claimed in claim 1, further forming a glue layer between the first substrate and the first dielectric layer.

5. The method as claimed in claim 1, wherein the first substrate comprises glass and the second substrate comprises silicon.

6. A method for fabricating package structures for optoelectronic devices, comprising:
   placing a device wafer between first and second substrates, comprising:
      a third substrate adjacent to the first substrate; and
      a first dielectric layer between the second and third substrates, comprising at least one pair of pads formed in the first dielectric layer;
   forming a first opening in the second substrate and the first dielectric layer to expose the surface and sidewall of the pair of pads;
   forming a metal layer directly on the exposed surface of each pad and covering the second substrate;
   forming a protective layer on the metal layer and filling the first opening in the first dielectric layer;
   forming at least one second opening in the protective layer, corresponding to each pad and exposing a portion of the metal layer on the second substrate;
   forming a solder ball in the second opening, electrically connecting to the metal layer; and
   dicing the device wafer and the first substrate along the first opening in the first dielectric layer.

7. The method as claimed in claim 6, further forming a second dielectric layer between the second substrate and the metal layer.

8. The method as claimed in claim 6, further forming a dam between the first and third substrates to form a cavity therebetween.

9. The method as claimed in claim 6, further forming a glue layer between the first and third substrates.

10. The method as claimed in claim 6, wherein the first substrate comprises glass and the second and third substrates comprises silicon.

* * * * *